United States Patent [19]
Keller et al.

[11] Patent Number: 6,128,232
[45] Date of Patent: Oct. 3, 2000

[54] METHOD FOR ERASING A NON-VOLATILE MEMORY ARRAY

[75] Inventors: Stephen A. Keller; Phat Xuan Mai; Timothy G. Nagel, all of Sugar Land, Tex.

[73] Assignee: Texas Instruments Incorporated, Dallas, Tex.

[21] Appl. No.: 09/382,024

[22] Filed: Aug. 24, 1999

Related U.S. Application Data
[60] Provisional application No. 60/101,384, Sep. 21, 1998.

[51] Int. Cl.$^7$ ...................................................... G11C 16/00
[52] U.S. Cl. .............................. 365/185.29; 365/185.19
[58] Field of Search ........................ 365/185.29, 185.19, 365/185.33, 106, 114

[56] References Cited

U.S. PATENT DOCUMENTS

| | | | |
|---|---|---|---|
| 5,394,002 | 2/1995 | Peterson | 365/185.29 |
| 6,009,033 | 12/1999 | Li et al. | 365/185.29 |

*Primary Examiner*—Tan T. Nguyen
*Attorney, Agent, or Firm*—Robert D. Marshall, Jr.; W. James Brady, III; Frederick J. Telecky, Jr.

[57] ABSTRACT

A method for erasing a non-volatile memory array (18) includes elevating the temperature of the memory array (18) during a ramp-up period. The memory array (18) is irradiated with ultraviolet light at an elevated temperature during an erase period. The temperature of the memory array (18) is incrementally decreased during a ramp-down period.

20 Claims, 2 Drawing Sheets

METHOD FOR ERASING A NON-VOLATILE MEMORY ARRAY

This application claims benefit of Provisional Application 60/101,384 filed Sep. 21, 1998.

TECHNICAL FIELD OF THE INVENTION

This invention relates generally to semiconductor devices and more particularly to a method for erasing a non-volatile memory array.

BACKGROUND OF THE INVENTION

Non-volatile memory arrays retain information in the absence of power. Examples of non-volatile memory arrays include flash memory, erasable programmable read-only memory (EPROM), and electrically-erasable programmable read-only memory (EEPROM). Non-volatile memory arrays may be used in a variety of electronic devices, such as microcontrollers, to provide storage capability.

A typical non-volatile memory cell may be formed using a double-polysilicon structure. This structure includes two layers of polysilicon. The upper polysilicon layer forms a control gate and word lines, and the lower polysilicon layer forms a floating gate. The floating gate, which is insulated by a gate-oxide layer, is capable of storing charge. The presence or absence of charge on the floating gate determines the digital value of the cell, with the presence of charge yielding a logical low and the absence of charge yielding a logical high.

In order to place charge on the floating gate, a relatively high voltage is applied to the control gate and the drain. As a result of this excitation, some of the electrons in the channel acquire enough energy to be transported from the channel through the gate-oxide layer and into the floating gate. Once the high voltage is removed, the electrons do not have enough energy to cross through the barrier of the gate-oxide layer. Thus, the charged cell may retain the charge on the floating gate indefinitely.

The negative charge captured in the floating gate makes the channel more positive and, thus, less conducting. As a result, the threshold voltage at the bit is higher for a charged cell than for an uncharged cell. Consequently, for a given voltage applied to the control gate, the non-volatile memory cell will conduct if the floating gate has no stored charge and will not conduct if the floating gate has stored charge. Therefore, a logical low or high is provided by the non-volatile memory cell based on whether or not the cell conducts at a given threshold voltage.

In order to remove charge from the floating gate, the non-volatile memory cell is irradiated with ultraviolet light. The ultraviolet light provides the stored electrons on the floating gate with enough extra energy to cross the barrier of the gate-oxide layer. However, this is a relatively time-consuming process. To reduce the time required to complete this process, the temperature of non-volatile memory arrays may be elevated during erasure to add to the energy obtained from the ultraviolet light. The use of elevated temperatures, however, has led to a high incidence of breakage of the relatively thin wafers on which the non-volatile memory arrays are fabricated.

SUMMARY OF THE INVENTION

In accordance with the present invention, a method for erasing a non-volatile memory array is provided that substantially eliminates or reduces the disadvantages or problems associated with previously developed methods. In particular, the present invention provides a method that reduces both the threshold voltages and the occurrence of wafer breakage during heat-accelerated ultraviolet erasure of a non-volatile memory array.

In one embodiment of the present invention, a method for erasing a non-volatile memory array includes elevating the temperature of the memory array during a ramp-up period. The memory array is irradiated with ultraviolet light at an elevated temperature during an erase period. The temperature of the memory array is incrementally decreased during a ramp-down period.

Technical advantages of the present invention include providing an improved method for erasing non-volatile memory arrays. In particular, the temperature of the memory array is incrementally ramped down to gradually decrease the temperature after erasure. As a result, there is a reduction in the incidence of wafer breakage and, thus, a corresponding reduction in the fabrication cost for the memory arrays.

Another technical advantage of the present invention includes providing a heat-accelerated ultraviolet erasure method that minimizes threshold voltages of cells in the non-volatile memory array. This is accomplished by removing ultraviolet radiation during the cooling of the wafer after erasure. The lower threshold voltages allow the cells in the memory array to function optimally under normal operating conditions.

A third technical advantage of the present invention includes providing an improved method for erasing non-volatile memory arrays using existing equipment. In particular, non-volatile memory arrays are erased through the use of existing equipment that allows a wafer comprising a plurality of non-volatile memory arrays to be heated to an elevated temperature, exposed to ultraviolet radiation, and incrementally cooled to the original temperature. Thus, the invention may be implemented without new equipment.

Other technical advantages of the present invention will be readily apparent to one skilled in the art from the following figures, descriptions and claims.

BRIEF DESCRIPTION OF THE DRAWINGS

For a more complete understanding of the present invention and its advantages, reference is now made to the following description taken in conjunction with the accompanying drawings, wherein like reference numerals represent like parts, in which.

DETAILED DESCRIPTION OF THE INVENTION

Figure 1:
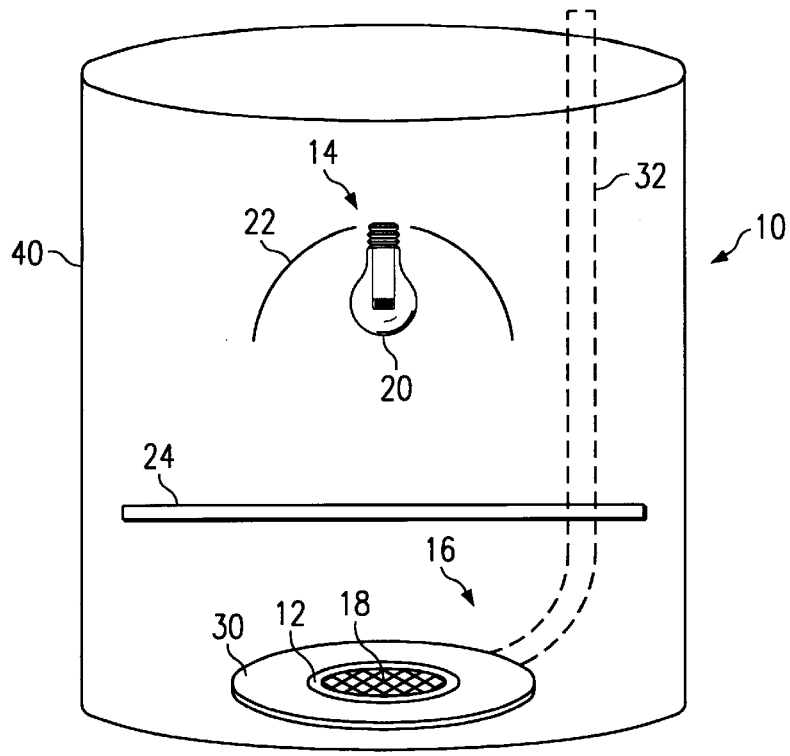
FIG. 1 is a block diagram illustrating a conventional non-volatile memory array erase system.
Figure 2:
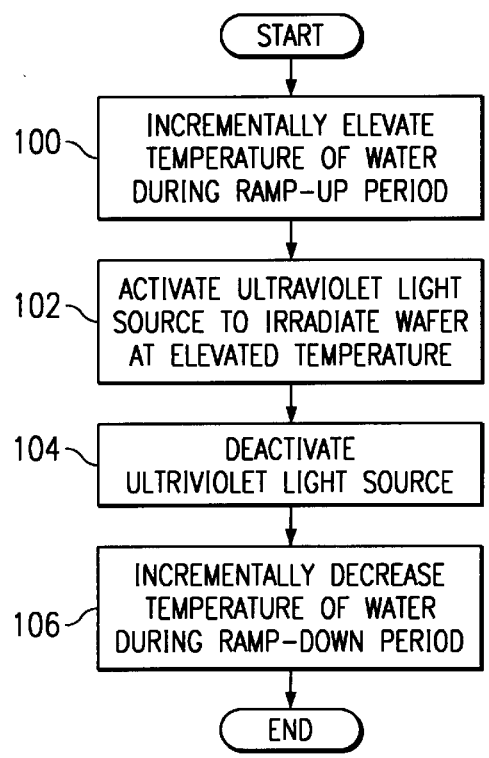
FIG. 2 is a flowchart illustrating a method for erasing non-volatile memory arrays using the system of FIG. 1.
Figure 3:
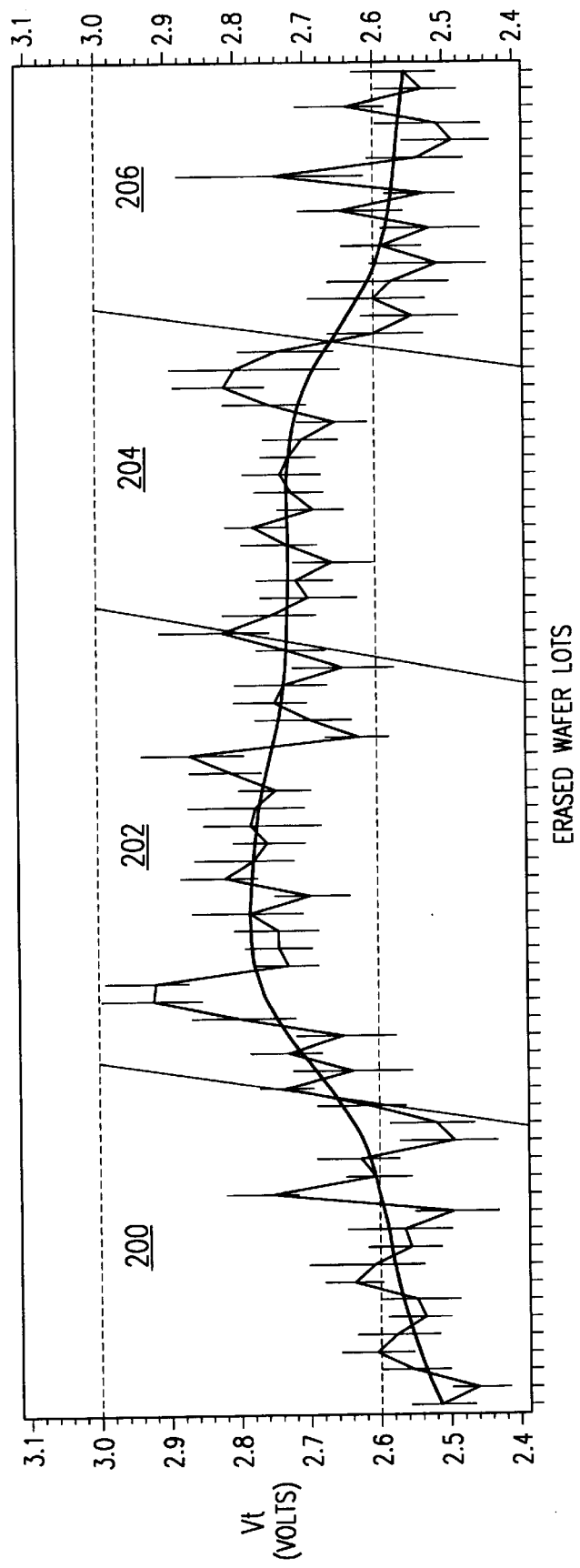
FIG. 3 is a chart illustrating the reduction in threshold voltage levels of a non-volatile memory array erased using the method of FIG. 2.

The preferred embodiments of the present invention and its advantages are best understood by referring now in more detail to FIGS. 1–3 of the drawings, in which like numerals refer to like parts. FIG. 1 is a block diagram illustrating a conventional non-volatile memory array erase system 10. Erase system 10 includes a wafer 12 disposed under an ultraviolet light source 14 and on a variable temperature element 16. The wafer 12 includes a plurality of non-volatile memory arrays 18 formed in or on the wafer 12. Each non-volatile memory array 18 comprises a plurality of memory cells, each having a charge-storing layer which may hold charge for an extended period of time and from which charge may be removed through the exposure of the memory cells to ultraviolet light. Non-volatile memory arrays 18 that may be erased using the method of the present invention include flash memory arrays, EPROM arrays, or EEPROM arrays.

The ultraviolet light source 14 includes an ultraviolet bulb 20, a reflector 22, and a diffuser 24. The bulb 20 generates ultraviolet radiation. The reflector 22 reflects the ultraviolet radiation generated by the bulb 20 toward the wafer 12. The diffuser 24 allows the ultraviolet radiation to be spread more evenly over the individual non-volatile memory arrays 18 in the wafer 12 by diffusing the ultraviolet radiation.

In an exemplary embodiment in which conventional flash memory arrays are to be erased, the bulb 20 generates ultraviolet light at a wavelength of about 200 nanometers and at an intensity of about 140–160 milliwatts per square centimeter. It will be understood that the intensity of the ultraviolet light may be varied depending on the type, structure, materials, configuration and other properties of the erase system 10, the wafer 12, and the non-volatile memory arrays 18. In the exemplary embodiment, the diffuser 24 is a mesh screen.

The variable temperature element 16 includes a conventional water-cooled hot chuck 30 and a heat exhaust 32. The hot chuck 30 includes an independent heat source, such as heating coils, to heat the hot chuck 30 and a chilled liquid jacket to cool the hot chuck 30.

The ultraviolet light source 14 and the variable temperature element 16 are disposed in an ultraviolet light housing 40 with the heat exhaust 32 extending to the exterior of the housing 40. The wafer 12 is loaded into the housing 40 from a load boat (not shown) and unloaded from the housing 40 to an unload boat (not shown) using conventional wafer handling apparatus and techniques.

The amount of time used to elevate and lower the temperature as well as to irradiate the wafer 12, in addition to the temperature of the wafer 12 during irradiation, is chosen in accordance with the number of metal layers in the memory array 18 and surrounding circuitry. Whether the memory design routes metal lines over the polysilicon layer may also be considered as a factor in making these determinations.

FIG. 2 is a flowchart illustrating a method for erasing the non-volatile memory arrays 18 using the erase system 10. The method begins at step 100 in which the temperature of the wafer 12, and thus the temperature of the memory arrays 18, is elevated using a water-cooled hot chuck 30. During this ramp-up period, the wafer temperature is incrementally raised to minimize heat stress induced by the different coefficients of thermal expansion of the materials that form the memory arrays 18. In an exemplary embodiment, the temperature is incremented by raising a set point of the hot chuck 30 by 20° C. approximately every twelve seconds. This time allows the wafer 12 to thermally stabilize after each increment, minimizing stress in the memory array 18. In the exemplary embodiment, the hot chuck 30 may be raised from about 50° C. to about 150° C. in about 60 seconds. It will be understood that the temperature may be otherwise suitably elevated, including being uncontrolled. If the temperature elevation is uncontrolled, then control of the temperature decrease may be relied upon to minimize breakage of the memory array 18.

Next, at step 102, the ultraviolet light source 14 is activated in order to irradiate the non-volatile memory arrays 18 at the elevated temperature. During this erase period, irradiation continues until the memory arrays 18 are substantially erased. The memory arrays 18 are substantially erased when the threshold voltages of the memory arrays 18 are decreased to an acceptable voltage level. According to the exemplary embodiment of the present invention where the flash memory arrays have two metal layers, the wafer 12 is irradiated for about four minutes with ultraviolet light having a wavelength of about 200 nanometers and an intensity of about 140–160 milliwatts per square centimeter. It will be understood that these values may be suitably adjusted for other memory designs.

In step 104, the ultraviolet light source 14 is deactivated so that the wafer 12 will not be exposed to ultraviolet radiation while the wafer temperature is being reduced. The absence of ultraviolet radiation reduces the energy of the electrons and prevents them from returning to the polysilicon layer during the time required to reduce the temperature of the wafer. Therefore, the threshold voltages of the associated memory cells are not increased by excess electrons returning to the polysilicon layer.

In step 106, the temperature of the wafer 12, and thus the temperature of the memory arrays 18, is decreased by the water-cooled hot chuck 30. During this ramp-down period, the wafer temperature is incrementally decreased to minimize heat stress induced by the different coefficients of thermal expansion of the materials that form the memory arrays 18. In the exemplary embodiment, the temperature is reduced by decreasing the set point of the hot chuck 30 by 20° C. approximately every twelve seconds. This time allows the wafer 12 to thermally stabilize after each decrease, minimizing breakage. In the exemplary embodiment, the hot chuck 30 may be reduced from about 150° C. to about 50° C. in about 60 seconds.

FIG. 3 is a chart illustrating the reduction in threshold voltage levels of non-volatile memory arrays 18 erased using the method of FIG. 2. On the chart, each point on the horizontal axis represents an erased wafer lot. The vertical axis represents the average associated threshold voltage for each lot of erased wafers 12. The target average threshold voltage for each lot was 2.6 volts. The graph is subdivided into four sections 200, 202, 204 and 206 along the horizontal axis, with each section 200, 202, 204 and 206 representing data from a different erasure method.

Section 200 illustrates data associated with a four-minute erase period without controlled temperature ramps. Thus, the amount of time used to elevate and decrease the temperatures of the wafers 12 erased by this method was not regulated. Threshold voltages in Section 200 were relatively low, but the incidence of wafer breakage was relatively high with this method.

Section 202 illustrates data associated with a two-minute erase period with one-minute ramp-up and ramp-down periods. Thus, the amount of time used to elevate and decrease the temperatures of the wafers 12 erased by this method was regulated at about 60 seconds. These ramps reduced the incidence of wafer breakage, but caused an increase in threshold voltages beyond the level required for the memory arrays 18 to function optimally under normal operating conditions.

Section 204 illustrates data associated with a four-minute erase period with one-minute ramp-up and ramp-down periods. Increasing the length of the erase period from two minutes to four minutes decreased threshold voltages slightly, but they remained beyond the optimum level.

Section 206 illustrates data associated with wafers 12 erased using the method of the present invention. As with Section 204, this method included a four-minute erase period with one-minute ramp-up and ramp-down periods. However, the wafers 12 represented in Section 206 were not exposed to ultraviolet radiation during the ramp-down period. This absence of exposure during the ramp-down period lowered the threshold voltages to the required level by preventing excess electrons from returning to the polysilicon layers of the memory cells. Also, the controlled ramp-up and ramp-down periods allowed the incidence of wafer breakage to remain relatively low, as with the wafers 12 represented in Sections 202 and 204. Thus, the wafers 12 represented in Section 206 had both low threshold voltages and a low incidence of wafer breakage.

Although the present invention has been described with several embodiments, various changes and modifications may be suggested to one skilled in the art. It is intended that the present invention encompass such changes and modifications as fall within the scope of the appended claims.

What is claimed is:

1. A method for erasing a non-volatile memory array, comprising:

elevating the temperature of the memory array during a ramp-up period;

irradiating the memory array with ultraviolet light at an elevated temperature during an erase period; and incrementally decreasing the temperature of the memory array during a ramp-down period.

2. The method of claim 1, wherein the temperature is decreased in increments of about 20° C.

3. The method of claim 1, further comprising incrementally elevating the temperature of the memory array during the ramp-up period.

4. The method of claim 3, wherein the temperature is elevated in increments of about 20° C.

5. The method of claim 1, further comprising not irradiating the memory array with ultraviolet light during the ramp-down period.

6. The method of claim 1, further comprising not irradiating the memory array with ultraviolet light during the ramp-up period.

7. The method of claim 1, wherein:

the ramp-up period is about 60 seconds;

the erase period is about 240 seconds; and the ramp-down period is about 60 seconds.

8. The method of claim 1, wherein the elevated temperature of the memory array is about 150° C.

9. The method of claim 1, further comprising irradiating the memory array with ultraviolet light having a wavelength of about 200 nanometers and an intensity of about 140–160 milliwatts per square centimeter.

10. The method of claim 1, wherein the memory array comprises a flash memory array.

11. A method for erasing a wafer having a plurality of non-volatile memory arrays, comprising:

positioning the wafer on a variable temperature element and under an ultraviolet light source;

elevating the temperature of the memory array with the variable temperature element during a ramp-up period;

activating the ultraviolet light source at an elevated temperature to irradiate the memory array with ultraviolet light during an erase period; and deactivating the ultraviolet light source while decreasing the temperature of the memory array during a ramp-down period.

12. The method of claim 11, further comprising deactivating the ultraviolet light source during the ramp-up period.

13. The method of claim 11, further comprising incrementally decreasing the temperature of the memory array with the variable temperature element during the ramp-down period.

14. The method of claim 11, further comprising changing the set point of the variable temperature element in predetermined increments at predetermined time intervals during the ramp-down period.

15. The method of claim 14, wherein the predetermined increments are about 20° C. and the predetermined time intervals are about twelve seconds.

16. The method of claim 11, further comprising incrementally elevating the temperature of the memory array during the ramp-up period.

17. The method of claim 11, wherein:

the ramp-up period is about 60 seconds;

the erase period is about 240 seconds; and the ramp-down period is about 60 seconds.

18. The method of claim 11, further comprising elevating the temperature of the memory array to about 150° C.

19. The method of claim 11, further comprising irradiating the memory array with ultraviolet light having a wavelength of about 200 nanometers and an intensity of about 140–160 milliwatts per square centimeter.

20. The method of claim 11, wherein the memory array comprises a flash memory array.

* * * * *